United States Patent
Lin

(10) Patent No.: US 10,642,227 B1
(45) Date of Patent: May 5, 2020

(54) DIGITAL-TO-TIME CONVERTER, TIME-TO-DIGITAL CONVERTER, AND CONVERTING METHOD USING THE SAME

(71) Applicant: Taiwan Semiconductor Manufacturing Co., Ltd., Hsinchu (TW)

(72) Inventor: Yu-Tso Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/354,176

(22) Filed: Mar. 15, 2019

(51) Int. Cl.
*H03M 1/82* (2006.01)
*G04F 10/00* (2006.01)
*H03K 5/01* (2006.01)
*H03K 5/00* (2006.01)
*H03K 19/20* (2006.01)

(52) U.S. Cl.
CPC ............ *G04F 10/005* (2013.01); *H03K 5/01* (2013.01); *H03K 19/20* (2013.01); *H03K 2005/00058* (2013.01)

(58) Field of Classification Search
CPC ........ G04F 10/005; H03K 5/01; H03K 19/20; H03K 2005/00058; H03M 1/50; H03M 1/82
USPC ......................................................... 341/152
See application file for complete search history.

(56) References Cited

U.S. PATENT DOCUMENTS

| | | | | |
|---|---|---|---|---|
| 6,373,301 | B1 * | 4/2002 | Chen | H03L 7/0805 327/141 |
| 9,137,084 | B2 * | 9/2015 | Degani | H04L 27/36 |
| 9,455,667 | B2 * | 9/2016 | Vlachogiannakis | H03B 5/1265 |
| 9,722,537 | B2 * | 8/2017 | Vlachogiannakis | H03B 5/1265 |
| 9,740,175 | B2 * | 8/2017 | Burg | H03L 7/091 |
| 9,774,336 | B2 * | 9/2017 | Liu | H03L 7/091 |
| 2010/0183066 | A1 * | 7/2010 | Chen | H03M 1/661 375/239 |
| 2015/0381337 | A1 * | 12/2015 | Madoglio | H04B 17/21 375/357 |
| 2016/0056827 | A1 * | 2/2016 | Vlachogiannakis | H03B 5/1265 327/158 |
| 2016/0182067 | A1 * | 6/2016 | Liu | H03L 7/091 327/158 |

* cited by examiner

*Primary Examiner* — Jean B Jeanglaude
(74) *Attorney, Agent, or Firm* — JCIPRNET

(57) ABSTRACT

A digital-to-time converter (DTC) includes a plurality of delay stages connected in series, in which each of the plurality of delay stages includes an input circuit and a delay circuit. The input circuit has a first input terminal, a second input terminal and a first output terminal, and is configured to receive a clock signal through the first input terminal, receive a digital control signal through the second input terminal, generate an output signal according to the clock signal and the digital control signal, and output the output signal to the first output terminal of the input circuit. The delay circuit is coupled to the input circuit in series, and is configured to receive the output signal and an input signal, and generate a delay signal according to the output signal and the input signal. The delay signal indicates a time interval corresponding to the digital control signal.

20 Claims, 4 Drawing Sheets

DIGITAL-TO-TIME CONVERTER, TIME-TO-DIGITAL CONVERTER, AND CONVERTING METHOD USING THE SAME

BACKGROUND

Time-to-digital converters (TDCs) and digital-to-time converters (DTCs) are used in a wide range of electronic applications to convert time interval signals to digital values, and vice versa. In practical manufacturing, poor linearity of a DTC and a TDC is one of dominant issues which is needed to be fixed or relaxed. A resolution and linearity of the DTC and the TDC may be caused a mismatch of parasitic resistance and capacitance among the components of the DTC and the TDC.

As demand for miniaturization and better performance for DTCs and DTCs has grown recently, there has grown a need for more creative designs for the DTCs and the TDCs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
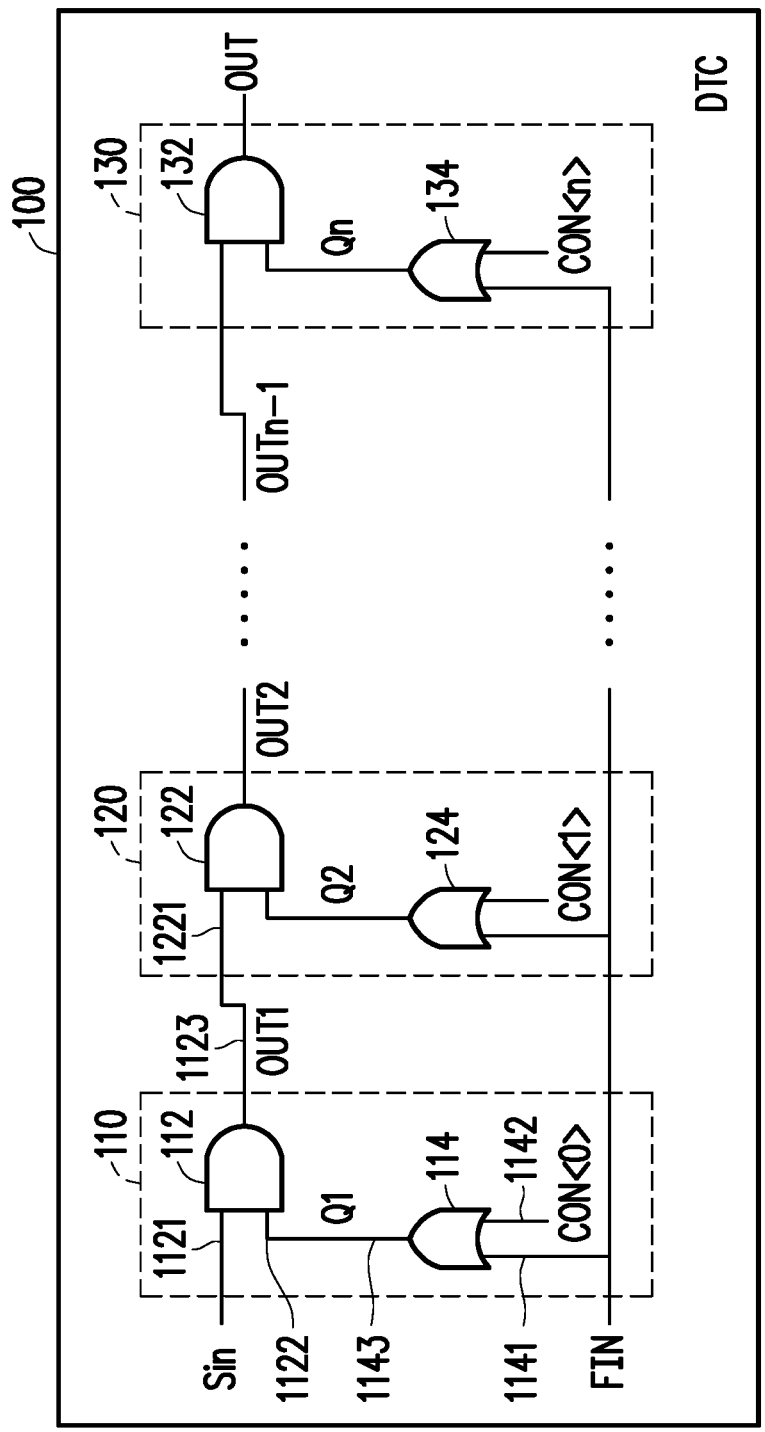
FIG. 1 is a schematic block diagram illustrating a digital-to-time converter (DTC), in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic block diagram of a digital-to-time converter (DTC) 100 in accordance with some embodiments. The DTC 100 includes a plurality of delay stages 110, 120 and 130 connected in series, in which each of the delay stages 110, 120 and 130 includes an input circuit and a delay circuit. The delay stage 110 includes an input circuit 114 and a delay circuit 112; the delay stage 120 includes an input circuit 124 and a delay circuit 122; and the delay stage 130 includes an input circuit 134 and a delay circuit 132.

The input circuit 114 has input terminals 1141, 1142, and an output terminal 1143, where the input terminal 1141 may receive a clock signal FIN and the input terminal 1142 is configured to receive a digital control signal CON<0>. The input circuit 114 is configured to generate an output signal Q1 according to the clock signal FIN and the digital control signal CON<0> received from the input terminals 1141 and 1142. The clock signal FIN may be generated by a clock generator (not shown), and the digital control signal CON<0> may be a control bit of a multi-bit control code. In some embodiments, the digital control signal CON<0> may be the most significant bit of the multi-bit control code. Alternatively, the digital control signal CON<0> may be a least significant bit of the multi-bit control code.

In some embodiments, the input circuit 114 is configured to block or allow the clock signal FIN to enter the subsequent circuits (e.g., delay circuit 112) of the delay stage 110 according to the digital control signal CON<0>. In some embodiments, the input circuit 114 may be or may include a logic gate (e.g., OR gate) that is configured to perform a logic operation (e.g. OR logic operation) to the clock signal FIN and the digital control signal CON<0> to generate the output signal Q1. It should be noted that the OR gate is given for exemplary purpose only, any other input circuits that have a function of allowing or blocking a clock signal using a digital control signal fall within the scope of the disclosure.

The delay circuit 112 includes input terminals 1121 and 1122 and an output terminal 1123. The input terminal 1121 may receive an input signal Sin; and the input terminal 1122 is coupled to the output terminal 1143 of the input circuit 114 to receive the output signal Q1. The delay circuit 112 is configured to generate a delay signal OUT1 according to the input signal Sin received from the input terminal 1121 and the output signal Q1 received from the output terminal 1143 of the input circuit 114. The generated delay signal is provided to the output terminal 1123 which is also an output of the delay stage 110. The delay circuit 112 may be or may include a logic gate (e.g., AND gate) which is configured to perform a logic operation (e.g., AND logic operation) to the input signal Sin and the output signal Q1 to generate the delay signal OUT1. It should be noted that the AND gate is given for exemplary purpose only, any other delay circuits that have a function of delaying fall within the scope of the disclosure.

The output terminal 1123 of the delay circuit 112 is coupled to the input terminal 1221 of the delay circuit 122 of the delay stage 120, where the delay stage 120 is next to the delay stage 110. In some embodiments, the input signal Sin may be a reference voltage signal with a predetermined voltage level (e.g., VDD), but the disclosure is not limited to any specific value of the reference voltage signal.

The input circuit 224 may receive the clock signal FIN and a digital control signal CON<1>, and is configured to generate an output signal Q2 according to the received clock signal FIN and the digital control signal CON<1>. The clock signal FIN that is inputted to the input circuit 114 of the delay stage 110 may be the same as the clock signal FIN that is inputted to the input circuit 124 of the delay stage 120; and the digital control signal CON<1> that is inputted to the input circuit 124 of the delay stage 120 and the digital control signal CON<0> that is inputted to the input circuit 114 of the delay stage 120 may be two adjacent bits of a multi-bit control code. In some embodiments, the input circuit 224 includes a logic gate (e.g., OR gate) that is configured to perform a logic operation (e.g., OR logic operation) to the clock signal FIN and the digital control signal CON<1> to generate the output signal Q2.

The delay circuit 122 may receive the output signal Q2 from the input circuit 124 and the delay signal OUT1 from the delay stage 110, and is configured to generate a delay signal OUT2 according to the output signal Q2 and the delay signal OUT1. In some embodiments, the delay circuit 122 may include a logic gate (e.g., AND gate) that is configured to perform a logic operation (e.g., AND logic operation) to the delay signal OUT1 and the output signal Q2 to generate the delay signal OUT2. The delay signal OUT2 is the output of the delay stage 120.

In some embodiments, the input circuit 134 of the delay stage 130 may receive the clock signal FIN and a digital control signal CON<n>, and is configured to generate an output signal Qn according to the clock signal FIN and the digital control signal CON<n>. In some embodiments, the input circuit 134 includes a logic gate (e.g., OR gate) that performs a logic operation (e.g., OR logic operation) to the clock signal FIN and the digital control signal CON<n> to generate an output signal Qn.

The delay circuit 132 of the delay stage 130 may receive a delay signal OUTn−1 from the previous delay stage and the output signal Qn from the input circuit 134, and is configured to generate a delay signal OUT according to the delay signal OUTn−1 and the output signal Qn. The delay stage 130 may be the final delay stage of the serial connected delay stages of the DTC 100, and the delay signal OUT is also the output of the serial connected delay stages 110, 120 and 130.

In some embodiments, a delay resolution of the DTC 100 is a delay of one delay stage among the delay stages 110 to 130. For example, when the delay circuit in each of the delay stages 110 to 130 is an AND gate, the delay resolution is a delay of one AND gate.

In some embodiments, the digital control signals CON<0> to CON<n> may be used to selectively activate or deactivate the delay stages 110 to 130, so as to generate the delay signal OUT with different delay intervals. When the input circuit of a specific delay stage among the delay stages 110 to 130 blocks the clock signal FIN from entering the subsequent circuits of the specific delay stage, the specific delay stage is considered as a deactivated delay stage. When the input circuit of a specific delay stage among the delay stages 110 to 130 allows the clock signal FIN from entering the subsequent circuits of the specific delay stage, the specific delay stage is considered as an activated delay stage. It should be noted that activated delay stages contribute to the generation of the delay signal OUT, and the deactivated delay stage do not contribute to the generation of the delay signal OUT.

In some embodiments, the delay signal OUT generated by the DTC 100 indicates a time interval corresponding to the digital control code CON<0> to CON<n> inputted to the DTC 100. As such, the DTC 100 may converter a digital code which is represented by the digital control signal CON<0> to CON<n> to the time interval.

In some embodiments, the input circuit and the delay circuit in each of the delay stages 110 to 130 are an OR gate and an AND gate, respectively. The delay resolution is one AND gate delay and output delay linearity is only related to OR gate and AND gate parasitic capacitance. Because the components (e.g., AND gate and OR gate) and structure of each delay stage 110 to 130 are the same or similar, the output linearity of the DTC is improved. In addition, a number of the active delay stages of the DTC 100 is proportional to a delay range of the DTC and is inversely proportional to the linearity of the DTC 100; and the number of the active delay stages may be adjustable according to the designed needs. For example, lower-bit unit delay stages of the DTC 100 may be disabled by simply setting the digital control signals. As such, a flexibility and the output linearity DTC 100 may be further improved.

Figure 2A:
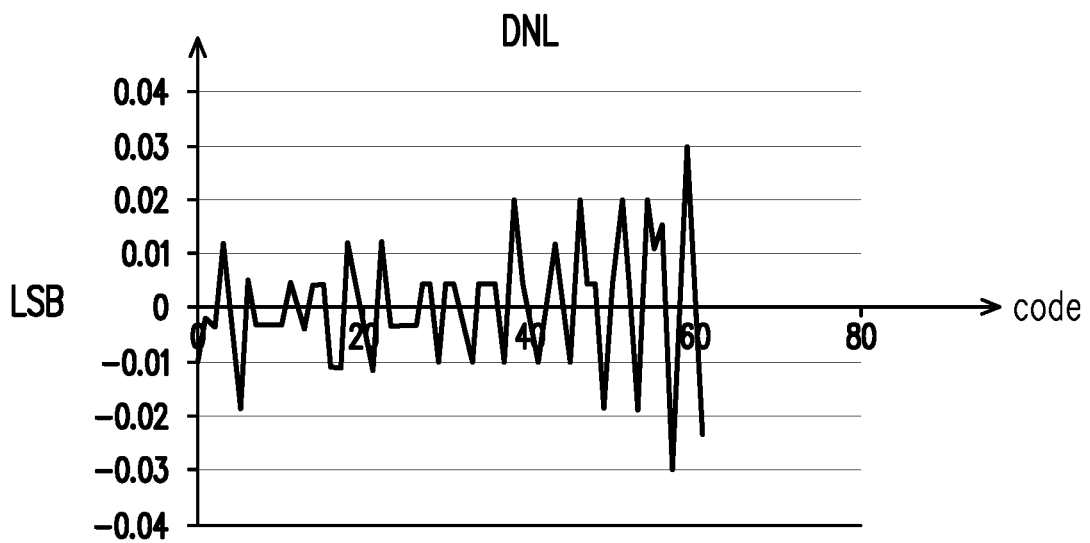
FIG. 2A and FIG. 2B are charts illustrating differential non-linearity (DNL) values and integral non-linearity (INL) values of a DTC, in accordance with some embodiments.
Figure 2B:
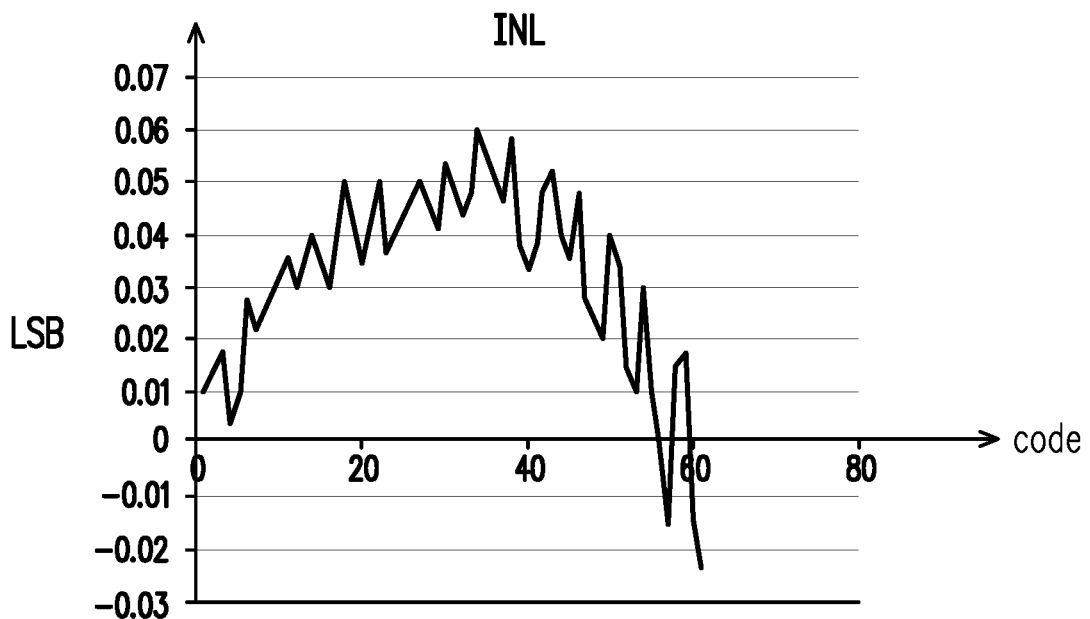

FIG. 2A and FIG. 2B illustrate charts of differential non-linearity (DNL) and integral non-linearity (INL) values of a DTC with respect to different digital codes, in accordance with some embodiments. The DNL and the INL values are used to measure non-linearity of the DTC and TDC, and are measured in a least significant bit (LSB) unit. More specifically, DNL values may describe the deviation between actual output values corresponding to adjacent digital input values; and INL may describe a deviation between an ideal output of the DTC and an actual output level. As shown in FIG. 2A and FIG. 2B, the DNL values of the DTC are less than 0.003 LSB and the INL values are less than 0.006 LSB. The DNL values and INL values may show the efficiency of the DTC in the disclosure.

Figure 3:
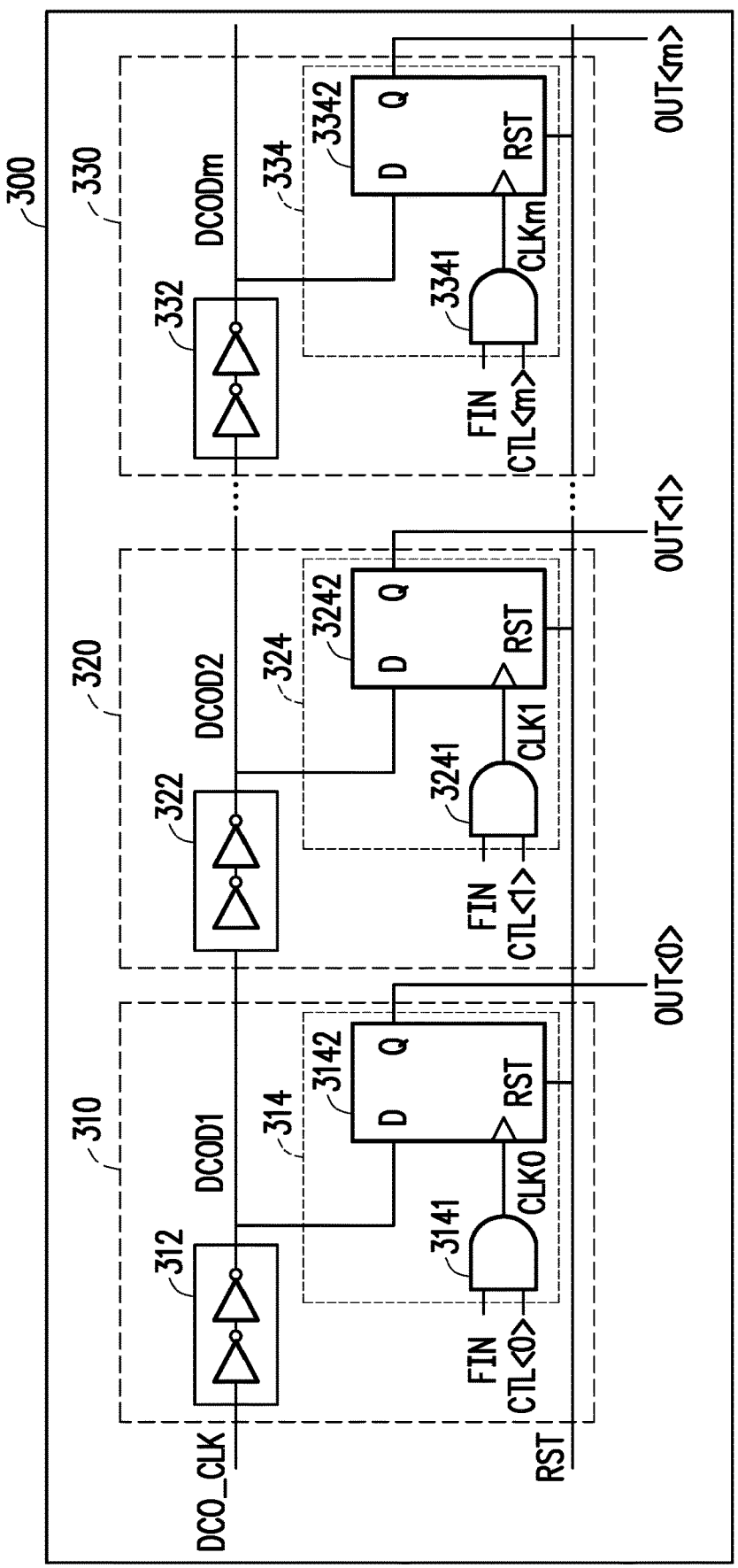
FIG. 3 is a schematic block diagram illustrating a time-to-digital converter (TDC), in accordance with some embodiments.

FIG. 3 illustrates a time-to-digital converter (TDC) 300 that includes a plurality of stages 310 to 330 coupled in series. The stage 310 includes a delay circuit 312 and a sampling circuit 314, where the delay circuit 312 receives a clock signal DCO_CLK and is configured to delay the clock signal DCO_CLK to generate a delay clock signal DCOD1. The clock signal DCO_CLK may be a digitally controlled oscillator clock signal that is generated by a clock generator (not shown). In some embodiments, the delay circuit 312 includes at least one inverter INV that is configured to delay the clock signal DCO_CLK. A number of the inverters INV in the delay circuit 312 is set according to the designed needs and is not limited in the disclosure.

In some embodiments, the sampling circuit 314 receives the delay clock signal DCOD1, a clock signal FIN and a digital control signal CTL<0>, in which a frequency of the clock signal FIN is lower than a frequency of the clock signal DCO_CLK. The sampling circuit 314 is configured to perform a sampling operation to sample the delay clock signal DCOD1 according to the clock signal FIN and the digital control signal CTL<0> to generate a digital output signal OUT<0>.

In some embodiments, the sampling circuit 314 includes a logic gate 3141 and a latch circuit 3142, in which the logic gate 3141 receives the clock signal FIN and the digital control signal CTL<0> and performs a logic operation to the clock signal FIN and the digital control signal CTL<0> to generate a clock signal CLK0. The latching circuit 3142 may be or may include a D-flip-flop (DFF), but the disclosure is not limited thereto. In some embodiments, the logic gate 3141 is configured to block or allow the clock signal FIN to enter the subsequent circuit (e.g., the latch circuit 3142) according to the digital control signal CTL<0>. In some embodiments, the logic gate 3141 is an AND gate that performs an AND operation to the clock signal FIN and the digital control signal CTL<0> to generate the clock signal CLK0. As such, when the digital control signal CTL<0> is in a high logic level (e.g., logic level of "1"), the logic gate 3141 allows the clock signal FIN to enter the subsequent circuits of the stage 310. When the digital control signal CTL<0> is in a low logic level (e.g., logic level of "0"), the logic gate 3141 blocks the clock signal FIN to enter the subsequent circuits of the stage 310.

In some embodiments, the control signal CTL<0> may be used to activate or deactivate the stage 110. For example, when the clock signal FIN is blocked by the digital control signal CTL<0>, the stage 110 is considered as being deactivated. In another example, when the clock signal FIN is allowed to enter the subsequent circuits of the stage 110 by the digital control signal, the stage 110 is considered as being activated.

The latch circuit 3142 receives the clock signal CLK0 from output of the logic circuit 3141 and the delay clock signal DCOD1 from the delay circuit 312, and is configured to sample the sample the clock signal DCOD1 according to the clock signal CLK0 to generate the digital output signal OUT<0>. The digital output signal OUT<0> may be a bit of a digital output code.

The stage 320 may include a delay circuit 322 and a sampling circuit 324, where the delay circuit 322 receives the delay clock signal DCOD1 outputted by the stage 310 and is configured to delay clock signal DCOD1 to generate a delay clock signal DCOD2. The sampling circuit 324 includes a logic gate 3241 and a latch circuit 3242, in which the logic gate 3241 receives the clock signal FIN and the digital control signal CTL<1> and performs a logic operation (e.g., AND logic operation) to the clock signal FIN and the digital control signal CTL<1> to generate a clock signal CLK1. In some embodiments, the latch circuit 3242 receives the clock signal CLK1 from output of the logic circuit 3241 and the delay clock signal DCOD2 from the delay circuit 322, and is configured to sample the delay clock signal DCOD2 according to the clock signal CLK2 to generate the digital output signal OUT<1>.

The stage 330 may include a delay circuit 332 and a sampling circuit 334, where the delay circuit 332 receives the delay clock signal outputted by a previous stage and is configured to generate a delay clock signal DCODm. In some embodiments, the sampling circuit 334 includes a logic gate 3341 and a latch circuit 3342, in which the logic gate 3241 receives the clock signal FIN and the digital control signal CTL<m> and performs a logic operation to the clock signal FIN and the digital control signal CTL<m> to generate a clock signal CLKm. The latch circuit 3342 receives the clock signal CLKm from output of the logic circuit 3341 and the delay clock signal DCODm from the delay circuit 332, and is configured to sample the delay clock signal DCODm according to the clock signal CLKm to generate the digital output signal OUT<m>.

In some embodiments, a reset signal RST may be provided to a reset pin of the latch circuit of each of the stages 310 to 330. In some embodiments, the TDC 300 may be reconfigurable by setting a number of active stages of the TDC 300 using the control signals CTL<0> to CTL<m>. Particularly, the control signals CTL<0> to CTL<m> may be used to activate some stages of the TDC 300 and deactivate the other stages of the TDC 300. In other words, a number of the active stages among the stages of the TDC 300 may be adjustable using the control signals CTL<0> to CTL<m>. In this way, the output linearity of the TDC is improved. In some embodiments, a number of the stages in the TDC may be determined in a manner of balancing between the output linearity and a detection range.

Figure 4:
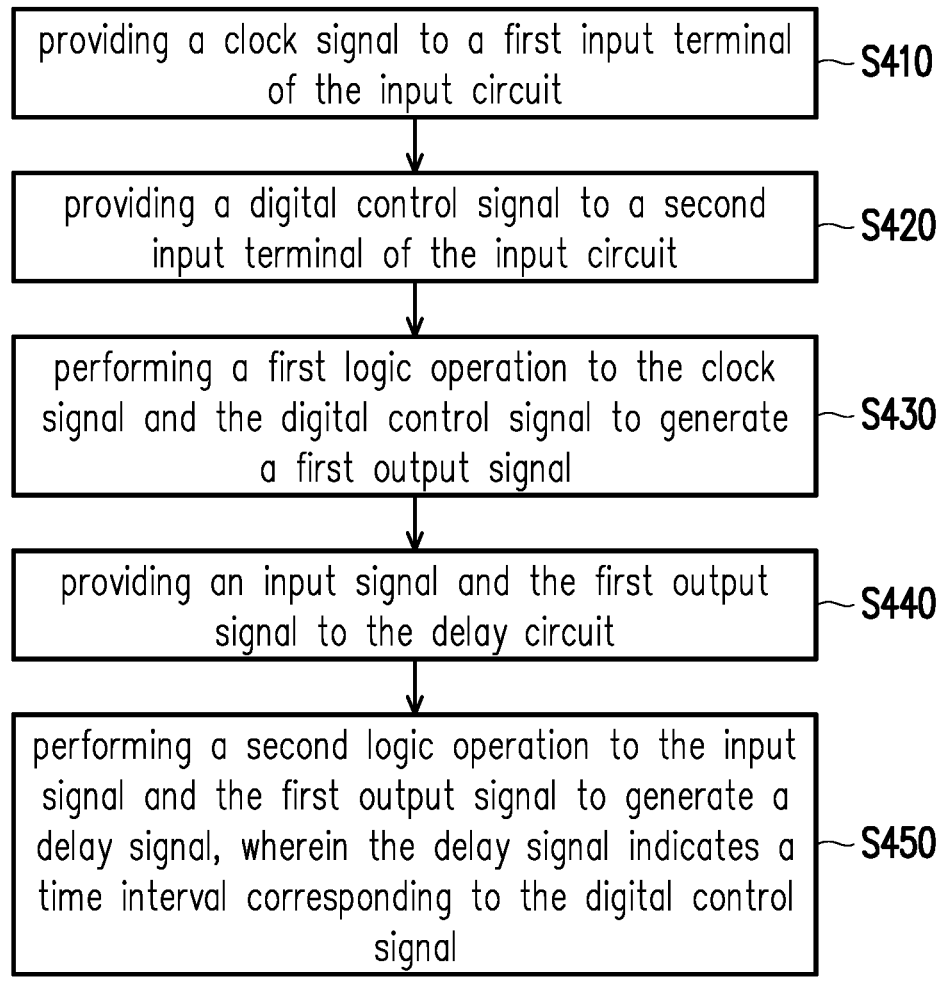
FIG. 4 is a flowchart diagram illustrating a converting method, in accordance with some embodiments.

FIG. 4 illustrates a converting method adapted to a DTC in accordance with some embodiments. In step S410, a clock signal is provided to a first input terminal of an input circuit. In step S420, a digital control signal is provided to a second input terminal of the input circuit. In steps S430, a first logic operation is performed to the clock signal and the digital control signal to generate an output signal. In some embodiments of the disclosure, the first logic operation may be an OR logic operation, but the disclosure is not limited thereto. In step S440, an input signal and the output signal are provided to the delay circuit; and in step S450, a second logic operation is performed to the input signal and the output signal to generate a delay signal. The delay signal indicates a time interval corresponding to the digital control signal. In some embodiments, the second logic operation is an AND logic operation, but the disclosure is not limited thereto.

According to some embodiments, a digital-to-time converter that includes a plurality of delay stages connected in series is introduced. Each of the delay stages includes an input circuit and a delay circuit. The input circuit has a first input terminal to receive a clock signal, a second input terminal to receive a digital control signal and a first output terminal. The input circuit is configured generate an output signal according to the clock signal and the digital control signal, and output the output signal to the first output terminal of the input circuit. The delay circuit is coupled to the input circuit in series and is configured to receive the output signal and an input signal. The delay circuit generates a delay signal according to the output signal and the input signal, wherein the delay signal indicates a time interval corresponding to the digital control signal.

According to some embodiments, a converting method adapted to a digital-to-time converter is introduced, where the digital to time converter has a plurality of delays stages, each of the plurality of delay stages having an input circuit and a delay circuit. The converting method comprising steps of providing a clock signal to a first input terminal of the input circuit; providing a digital control signal to a second input terminal of the input circuit; performing a first logic operation to the clock signal and the digital control signal to generate an output signal; providing an input signal and the output signal to the delay circuit; and performing a second logic operation to the input signal and the output signal to generate a delay signal, wherein the delay signal indicates a time interval corresponding to the digital control signal.

According to some embodiments, a time-to-digital converter having a plurality of stages connected in series is introduced. Each of the stages includes a delay circuit and a sampling circuit. The input circuit is configured to receive a first clock signal and delay the first clock signal to generate a delay clock signal. The sampling circuit is configured to receive a second clock signal, a digital control signal and the delay clock signal, and perform a sampling operation to sample the delay clock signal according to the second clock signal and the digital control signal to generate a digital output signal. A frequency of the first clock signal is greater than a frequency of the second clock signal, and the sampling circuit of each of the plurality of stages is activated or deactivated according to the digital control signal.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A digital-to-time converter, comprising:
a plurality of delay stages connected in series, wherein each of the plurality of delay stages comprises:
an input circuit, having a first input terminal, a second input terminal and a first output terminal, configured to receive a clock signal through the first input terminal, receive a digital control signal through the second input terminal, generate an output signal according to the clock signal and the digital control signal, and output the output signal to the first output terminal of the input circuit; and
a delay circuit, coupled to the input circuit in series, and configured to receive the output signal and an input signal, and generate a delay signal according to the output signal and the input signal, wherein the delay signal indicates a time interval corresponding to the digital control signal.

2. The digital-to-time converter of claim 1, wherein the delay circuit comprises:
a third input terminal, coupled to the first output terminal of the input circuit;
a fourth input terminal, configured to receive the input signal; and
a second output terminal, configured to output the delay signal.

3. The digital-to-time converter of claim 2, wherein the delay stages comprise a first delay stage and a second delay stage, the second delay stage is next to the first delay stage, and the delay signal of a first delay stage is the input signal of the second delay stage.

4. The digital-to-time converter of claim 2, wherein
the input circuit comprises a first logic gate, and the input circuit is configured to perform a first logic operation to the clock signal and the digital control signal using the first logic gate to generate the output signal, and
the delay circuit comprises a second logic gate, and the delay circuit is configured to perform a second logic operation to the output signal and the input signal to generate the delay signal.

5. The digital-to-time converter of claim 4, wherein the first logic gate is an OR gate, the first logic operation is an OR logic operation, the second logic gate is an AND gate, and the second logic operation is an AND logic operation.

6. The digital-to-time converter of claim 2, wherein each of the plurality of delay stages is activated or deactivated according to the digital control signal.

7. The digital-to-time converter of claim 6, wherein
a number of delay stages to be activated is adjusted according to the digital control signal,
the digital control signal is configured to block the clock signal to a delay stage among the plurality of the delay stages to deactivate the delay stage, and
the digital control signal is configured to allow the clock signal to a delay stage among the plurality of the delay stages to active the delay stage.

8. A converting method adapted to a digital-to-time converter having a plurality of delays stages, each of the plurality of delay stages having an input circuit and a delay circuit, the converting method comprising:
providing a clock signal to a first input terminal of the input circuit;
providing a digital control signal to a second input terminal of the input circuit;
performing a first logic operation to the clock signal and the digital control signal to generate an output signal;
providing an input signal and the output signal to the delay circuit;
performing a second logic operation to the input signal and the output signal to generate a delay signal, wherein the delay signal indicates a time interval corresponding to the digital control signal.

9. The converting method of claim 8, wherein the first logic operation is an OR logic operation and the second logic operation is an AND logic operation.

10. The converting method of claim 8, wherein the digital control signal is configured to activate or deactivate each of the plurality of delay stages.

11. The converting method of claim 10, wherein
a number of delay stages to be activated is adjusted according to the digital control signal,
the digital control signal is configured to block the clock signal to a delay stage among the plurality of delay stages to deactivate the delay stage; and
the digital control signal is configured to allow the clock signal to a delay stage among the plurality of delay stages to active the delay stage.

12. A time-to-digital converter, comprising:
a plurality of stages connected in series, wherein each of the plurality of stages comprises:
a delay circuit, configured to receive a first clock signal and delay the first clock signal to generate a delay clock signal;
a sampling circuit, configured to receive a second clock signal, a digital control signal and the delay clock signal, and perform a sampling operation to sample the delay clock signal according to the second clock signal and the digital control signal to generate a digital output signal,
wherein a frequency of the first clock signal is greater than a frequency of the second clock signal, and the sampling circuit of each of the plurality of stages is activated or deactivated according to the digital control signal.

13. The time-to-digital converter of claim 12, wherein the sampling circuit comprises:
a logic gate, having a first input terminal and a second input terminal, wherein the first input terminal receives the second clock signal, the second input terminal receives the digital control signal, and the logic gate is configured to perform a logic operation to the second clock signal and the digital control signal to generate a third clock signal.

14. The time-to-digital converter of claim 13, wherein the sampling circuit further comprises:
a latch circuit, coupled to the delay circuit and the logic gate, configured to receive the delay clock signal from the delay circuit and the third clock signal from the logic gate, and sample the delay clock signal according to the third clock signal to generate the digital output signal.

15. The time-to-digital converter of claim 13, wherein the logic operation is configured to activate or deactivate each of the stages according to the digital control signal.

16. The time-to-digital converter of claim 15, wherein a number of stages to be activated is adjusted according to the digital control signal.

17. The time-to-digital converter of claim 15, wherein
the digital control signal is configured to block the second clock signal to a stage among the plurality of the stages to deactivate the stage, and
the digital control signal is configured to allow the second clock signal to a stage among the plurality of the stages to active the stage.

18. The time-to-digital converter of claim 14, wherein the logic gate is an AND gate, and the logic operation is an AND logic operation.

19. The time-to-digital converter of claim 12, wherein
the plurality of stages comprises a first stage and a second stage,
the second stage is next to the first stage, and
an output terminal of the delay circuit of the first stage is coupled to an input terminal of the delay circuit of the second stage.

20. The time-to-digital converter of claim 12, wherein the delay circuit includes at least one inverter.

\* \* \* \* \*